United States Patent [19]

Potter

[11] Patent Number: 5,473,555
[45] Date of Patent: Dec. 5, 1995

[54] METHOD AND APPARATUS FOR ENHANCING FREQUENCY DOMAIN ANALYSIS

[75] Inventor: Ronald W. Potter, Snohomish, Wash.

[73] Assignee: Hewlett-Packard Company, Palo Alto, Calif.

[21] Appl. No.: 286,497

[22] Filed: Aug. 4, 1994

Related U.S. Application Data

[63] Continuation of Ser. No. 8,451, Jan. 22, 1993, abandoned, which is a continuation-in-part of Ser. No. 722,377, Aug. 25, 1991, Pat. No. 5,235,534, which is a continuation of Ser. No. 565,853, Aug. 9, 1990, abandoned, which is a continuation of Ser. No. 234,460, Aug. 18, 1988, abandoned.

[51] Int. Cl.$^6$ ............................................. G06F 17/10
[52] U.S. Cl. .................. 364/724.1; 364/724.12; 364/724.18
[58] Field of Search ............... 364/724.1, 724.18, 364/723, 74.12

[56] References Cited

U.S. PATENT DOCUMENTS

| | | | |
|---|---|---|---|
| 3,715,715 | 2/1973 | Ruehle | 340/15.5 DP |
| 3,963,987 | 6/1976 | Rivere | 324/166 |
| 4,020,332 | 4/1977 | Crochiere et al. | 364/724.1 |
| 4,031,366 | 6/1977 | Hartung | 235/151.3 |
| 4,426,641 | 1/1984 | Kurihara et al. | 340/683 |
| 4,455,613 | 6/1984 | Shoemaker | 364/487 |
| 4,488,240 | 12/1984 | Kapadia et al. | 364/508 |
| 4,542,336 | 9/1985 | Powell | 324/77 B |
| 4,578,755 | 3/1986 | Quinn et al. | 364/431.01 |
| 4,604,720 | 8/1986 | Stikvoort | 364/724.1 |
| 4,654,634 | 3/1987 | Thong et al. | 340/247 R |
| 4,667,297 | 5/1987 | Kawai | 364/565 |
| 4,674,125 | 6/1987 | Carlson et al. | 364/724.1 |
| 4,689,759 | 8/1987 | Anouar et al. | 364/572 |
| 4,709,394 | 11/1987 | Bessler et al. | 364/723 |
| 4,716,472 | 12/1987 | McNally | 360/8 |
| 4,718,104 | 1/1988 | Anderson | 364/723 |
| 4,782,324 | 5/1987 | Underwood | 341/147 |
| 4,789,950 | 12/1988 | Saxe et al. | 364/377 |
| 4,825,398 | 4/1989 | Koch et al. | 364/724.1 |
| 4,866,647 | 9/1989 | Farrow | 364/724.1 |
| 4,912,661 | 3/1990 | Potter | 364/550 |
| 5,033,019 | 7/1991 | White | 364/724.18 |
| 5,235,534 | 8/1993 | Potter | 364/724.1 |
| 5,301,266 | 4/1994 | Kimura | 364/724.18 |

FOREIGN PATENT DOCUMENTS

| | | |
|---|---|---|
| 323696 | 7/1989 | European Pat. Off. . |
| 099600 | 2/1994 | European Pat. Off. . |

OTHER PUBLICATIONS

McFadden, "Interpolation Techniques for the Time Domain Averaging of Vibration Data with Application to Helicopter Gearbox Monitoring", Australia Aeronautical Research Laboratories, Aero Propulsion Technical Memorandum 437, Sep. 1986.

(List continued on next page.)

Primary Examiner—David H. Malzahn

[57] ABSTRACT

A signal processing technique allows accurate interpolation between points of a sampled frequency domain function. A time-based sampling process samples a time waveform of duration T having a sub time interval T'. A signal processor applies a discrete Fourier transform over a time period T to transform the sampled data from the time domain to the frequency domain. The sampled frequency domain data is convolved with one or more convolution kernels to yield a continuous line shape. The result of this convolution permits the spectral composition at arbitrary frequencies to be determined. The disclosed frequency domain interpolation process is characterized by preservation of data in the T' interval of the time domain with an arbitrary but specified degree of accuracy.

35 Claims, 3 Drawing Sheets

OTHER PUBLICATIONS

Pope, "Basic Studies of Automobile Tire Noise," Ph.D. Dissertation, Stanford University, May, 1978.

Hildebrand, "Lagrangian Methods," Introduction to Numerical Analysis, Chapter 3, (2d ed. 1973), pp. 81–115.

Schafer and Rabiner, "A Digital Processing Approach to Interpolation," Proceedings of the IEEE, vol. 61, No. 6, Jun. 1973, pp. 692–702.

Oppenheim, *Discrete–Time Signal Processing*, Sections 3.2–3.8, 1989 by Prentice–Hall, Inc., pp. 82–131.

Oppenheim, *Discrete–Time Signal Processing*, Sections 11.0–11.8, 1989 by Prentice–Hall, Inc., pp. 695–756.

Novak, "Radio–Frequency Measurement With Interpolation In FFT Spectra," Meres es Automatika, vol. 35, No. 9, 1987, pp. 335–338 (Hungarian article with translated abstract).

Goto, "Generalized Interpolation Formulas for FFT Spectra of Exponentially Damped Sinusoids," The Transactions of the IEICE, vol. E 73, No. 7, Jul. 1990, pp. 1166–1175.

Addison, "Alterantive Frequency Domain Interpolation Algorithms for Improvement of FFT Outputs in Radar Signal Processing," IEEE NAECON 1984, vol. 1, pp. 49–53.

Leondes, "Frequency Domain Interpolation," IEEE AES, 1977, vol. AES–13, No. 3, pp. 323–327.

METHOD AND APPARATUS FOR ENHANCING FREQUENCY DOMAIN ANALYSIS

RELATED APPLICATION DATA

This is a continuation of application Ser. No. 08/008,451 filed on Jan. 22, 1993, now abandoned, which in turn is a continuation-in part of my application Ser. No. 07/722,377, filed Aug. 25, 1991, now U.S. Pat. No. 5,235,534, which is a continuation of my application Ser. No. 07/565,853, filed Aug. 9, 1990, now abandoned, which is a continuation of my application Ser. No. 07/234,460, filed Aug. 18, 1988, now abandoned. The disclosure of U.S. Pat. No. 5,235,534 is incorporated herein by reference.

A European counterpart to my application Ser. No. 07/234,460 was published by the European Patent Office on Feb. 28, 1990, as EP 355,293A. That publication, which now forms part of the art available to those working in this field, is also explicitly incorporated herein by reference.

FIELD OF THE INVENTION

The present invention relates to signal processing techniques, and more particularly relates to a method for resampling a sampled frequency function at interpolated points.

BACKGROUND AND SUMMARY OF THE INVENTION

Digital signal processing (DSP) techniques have greatly extended the capabilities and cost-effectiveness of electronic test and measurement instruments. A drawback, however, has been DSP's reliance on sampled data.

In sampled data systems, a signal under analysis is represented by one or more attributes at periodically spaced intervals. A familiar example is an electrical signal whose magnitude is sampled at periodic time intervals. This sampled set of data is used to represent the signal in subsequent analysis. Another example is an electrical signal whose spectral composition is sampled at periodic frequency intervals. This type of sampling is familiar from the bar graph display on a spectrum analyzer, wherein each bar (or line) represents the amplitude or power of the signal at a discrete frequency.

While representation of data in a sampled fashion facilitates use of powerful analysis techniques (such as the Fast Fourier Transform, or FFT), it introduces ambiguities in the knowledge base. In particular, attributes of the signal between the periodically spaced intervals are unknown. Interpolation is sometimes used to ameliorate this failing.

Interpolation typically involves the application of a set of assumptions to known data points so as to gain an understanding about the behavior of the data between these points. In a familiar case, the assumption is that the data changes linearly between the data points. This assumption results in straight lines connecting the known data points. In other cases, the assumption is that the data takes the shape of a smooth curve which can be approximated by a fitting a polynomial equation to successive ones of the known data points.

In digital signal analysis, these prior art interpolation techniques have a serious failing. They tend to corrupt data in the other domain. For example, a sampled signal in the time domain may be transformed to a sampled signal in the frequency domain by an FFT. If the sampled frequency domain signal is interpolated to yield a continuous spectral function, and this continuous function is then transformed back to the time domain, the resulting time domain signal will no longer match the original time domain signal. This corruption is due to the interpolation in the frequency domain.

Likewise, if a sampled frequency domain signal is transformed into the time domain, interpolated, and then transformed back into the frequency domain, the frequency domain representation will be significantly altered, The corruption is again due to interpolation—this time in the time domain.

The latter problem of time domain interpolation has been addressed by techniques disclosed in my above-referenced applications. The former problem of frequency domain interpolation persists.

In accordance with the present invention, interpolation of a sampled frequency domain signal is accomplished while preserving the corresponding data in the time domain within some specified degree of error. In the preferred embodiment, this is achieved as follows: In the time domain, a particular record of interest, having length T', is identified within a longer record having length T. This longer record is transformed into the frequency domain using an FFT, resulting in a set of discrete frequency domain samples spaced at a frequency of 1/T. This discrete spectrum is then convolved with a continuous convolution kernel to provide an interpolated curve. This curve represents the spectral composition of the signal at all frequencies, including those between the original discrete frequency domain samples produced by the FFT. This curve can be resampled at frequencies of particular interest (such as 1/T') for use in subsequent analysis.

The accuracy of this technique is dependent on the particular convolution kernel used, and on the length of record T relative to T'. In the time domain, the convolution kernel corresponds to a window (the "interpolation window") that eliminates all but one of the periods T of the time record. Ideally, this window would have the shape of a rectangle centered on the interval T. Such a window would pass all data in the window without distortion, and would perfectly attenuate all data outside this time interval. The continuous convolution kernel of such a rectangular window, however, is infinite in extent and thus presents difficulties in implementation.

An alternative, generally preferable interpolation window is one that is substantially flat over the record T' of particular interest, and then slopes down to a suitable attenuation level for all times outside the longer record T. Convolution kernels for such compromise interpolation windows are relatively straightforward to implement.

In the preferred embodiment, the values of the time record outside the period of particular interest T' —but still within the longer record T—are forced to zero. These points are not the subject of the analysis, and this expedient enhances the rectangular attributes of the compromise interpolation window.

By such techniques, it is possible to accurately resample at interpolated points in a sampled frequency domain. The accuracy of this technique is limited only by the flatness of the compromise interpolation window and by the degree of attenuation of the images beyond the T interval. This window can be forced to an arbitrary specification by choosing an appropriate convolution kernel. Thus, frequency domain interpolation of arbitrary accuracy can be achieved.

The foregoing and additional features and advantages of the present invention will be more readily apparent from the following detailed description, which proceeds with reference to the accompanying drawings.

DETAILED DESCRIPTION

Figure 1:
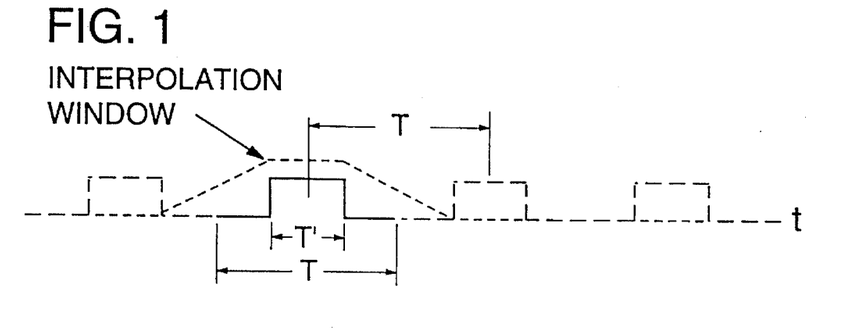
FIG. 1 shows a time domain signal including a portion of length T' that is assumed to repeat with period T, and additionally shows a compromise interpolation window.

Referring to FIG. 1, assume that a finite time record of length T' is of particular interest and has been identified within a longer time record of length T. (The dashed lines in FIG. 1 are images and not part of the original data signal.) If the frequency spectrum of this total time record is calculated by means of a FFT in which the time data is assumed to be periodic with period T, the resulting spectrum will be sampled at frequency intervals of 1/T. This is shown by the dashed lines in FIG. 2. Under certain constraints, it is possible to interpolate the spectrum between these 1/T sample points of FIG. 2, and to resample the resulting continuous curve (i.e compute its value) at a new set of arbitrarily selected frequencies.

An important step in obtaining a continuous version of a sampled frequency spectrum is to eliminate all but one of the periods T of the time record. This can be accomplished by multiplying the periodic time record by a rectangle with unit height and width T. To isolate the subinterval T', multiply the time record by a rectangle with unit height and width T', centered on the desired T' time interval, yielding the solid line portion of FIG. 3. In the frequency domain, this corresponds to the convolution of the sampled spectrum with a continuous kernel of the form:

$$\frac{\sin(\pi f T')}{\pi f} \quad (1)$$

This is the Fourier transform of a unit rectangle having length T'.

A continuous convolution kernel cannot be stored directly in a computer memory, but it can be stored in equation form. Alternately, it can be stored in a large table, within which a simple interpolation procedure can be used to obtain a good approximation to a continuous function.

Figure 2:
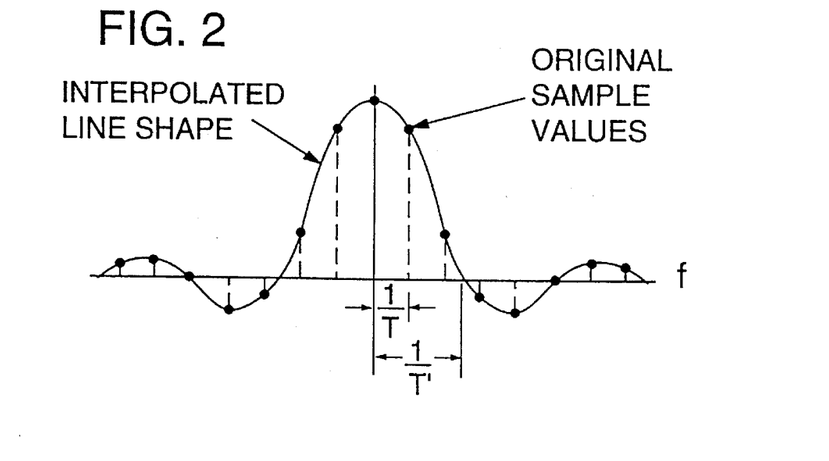
FIG. 2 shows, in dashed lines, the sampled frequency domain representation that results from an FFT analysis of the time signal of FIG. 1, and shows in solid lines the interpolated curve that results from convolution of the sampled frequency spectrum with a continuous convolution kernel.

Application of the continuous convolution kernel to the sampled, dashed line frequency spectrum of FIG. 2 yields the continuous curve shown by the solid line. Once this continuous curve has been obtained, it can be resampled at any desired frequency spacing less than or equal to 1/T'.

In practice, the operations of continuous convolution and resampling are replaced with the calculation of the convolution between the continuous kernel and the original sampled spectrum at only the discrete frequencies indicated by the resampling specification. This eliminates the need to store a continuous convolution result before resampling.

As an example, suppose it is desired to determine the frequency composition of the signal of FIG. 1 at frequency intervals of 1/T' (corresponding to the subinterval T' of particular interest). The original sampled frequency domain data resulting from the FFT (dashed lines in FIG. 2) gives spectral information only at frequency intervals of 1/T. To obtain data at a different set of points, a curve must be interpolated between the known frequency points and then resampled at the desired frequency points. This is done by convolving the known frequency points with a continuous convolution kernel. This operation yields the continuous, solid curve of FIG. 2. The convolution equation can be solved at points having frequency spacings of 1/T' to yield spectral information at these interpolated points. This resampling yields the data shown in FIG. 4, which are interpolated frequency samples spaced at intervals of 1/T'.

Figure 3:
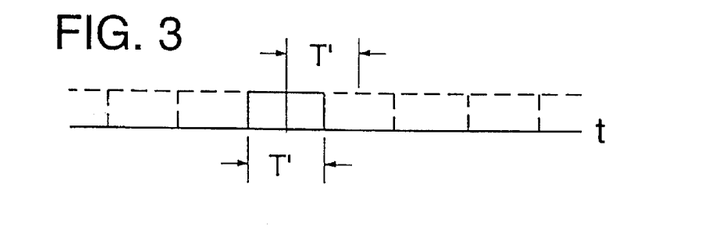
FIG. 3 shows the time domain counterpart to the interpolated frequency spectrum of FIG. 4, illustrating that the time domain waveform shape has not been materially corrupted by the interpolation in the frequency domain.
Figure 4:
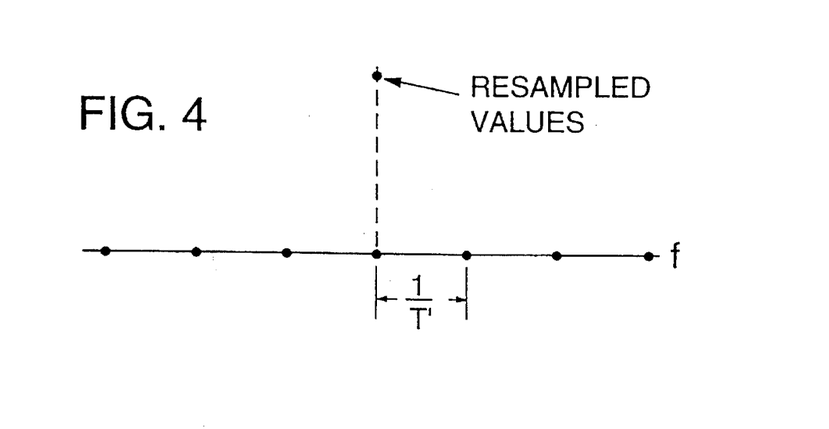
FIG. 4 shows the continuous curve of FIG. 2 sampled at an interpolated frequency spacing of 1/T'.

If the interpolated, resampled frequency spectrum of FIG. 4 is transformed back into the time domain, the time record of FIG. 3 results. As can be seen, this time record corresponds Cs almost identically with the original record T' of FIG. 1. (The FIG. 3 record is infinitely replicated with period T', reflecting the fact that the frequency domain representation of FIG. 4 is sampled at 1/T' intervals.)

Note that there is no lower limit on the new sample spacing, but there is an upper limit. If the resample spacing is too great, the time domain counterpart will include overlapping images, introducing errors into both the time and frequency domain. The upper limit on the resample spacing is determined by the convolution kernel selected. If a convolution kernel of the form of equation (1) is selected, the upper limit on the resampling frequency will be 1/T'.

Unfortunately, convolution with the foregoing equation (1) is difficult and time consuming because this function extends to infinity in both directions. A more practical approach is to oversample the frequency spectrum by forcing T>T', and padding the time record between T' and T with zero values. Then it becomes possible to design a compromise time domain interpolation window (shown as a dotted line in FIG. 1) that approximates a rectangle over the T' interval, but whose Fourier transform is finite in extent. This allows the convolution operation to be performed using a finite kernel, greatly improving the speed of this step. The ratio T/T' is called the oversampling factor. The larger this factor, the shorter the convolution kernel.

The compromise time domain interpolation window (whose transform is the convolution kernel) should be substantially flat over the interval T' and should essentially eliminate all other periods of the waveform. Any deviation from flatness will distort the time domain counterpart to the interpolated frequency domain curve, and any residual time images will cause wrap-around errors after resampling. Fortunately, the window can be made as good as necessary by use of a suitable convolution kernel. The flatter the window and the greater the time image attenuation, the longer the convolution kernel.

It is sometimes desirable to implement the interpolation procedure with a combination of continuous and discrete frequency convolution kernels. (The order of convolution operations is immaterial.) For example, a continuous convolution kernel might be used to attenuate the time domain images outside the period T, without concern for the flatness of the window over the time interval of interest T'. A discrete frequency convolution might then be used to flatten this region T' to the required specifications.

Figure 5:
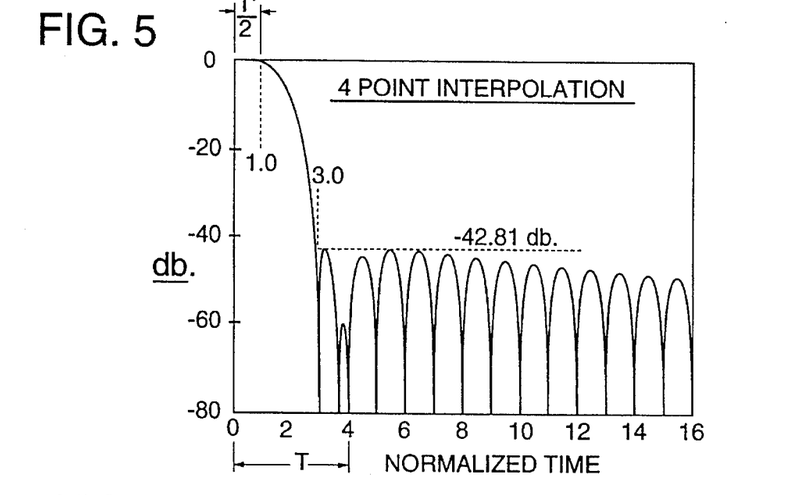
FIG. 5 depicts half of a compromise time domain interpolation window useful in producing the continuous curve of FIG. 2.

FIG. 5 shows half of a compromise time domain interpolation window designed for 2:1 oversampling. Over the time interval 0–T'/2, the window is substantially flat. Over the time interval T'/2 to T, the skirts of the window slope downwardly, increasing attenuation of the signal. This is the zero-padded portion of the time record, so the shape of the window here is of little consequence. Over the interval T to 3T'/2, the window attenuation increases. Finally, for all times after T'/2, the window provides attenuation in excess of 42 dB. The unwanted time images in FIG. 1 are thus all attenuated at least 42 dB.

Figure 6:
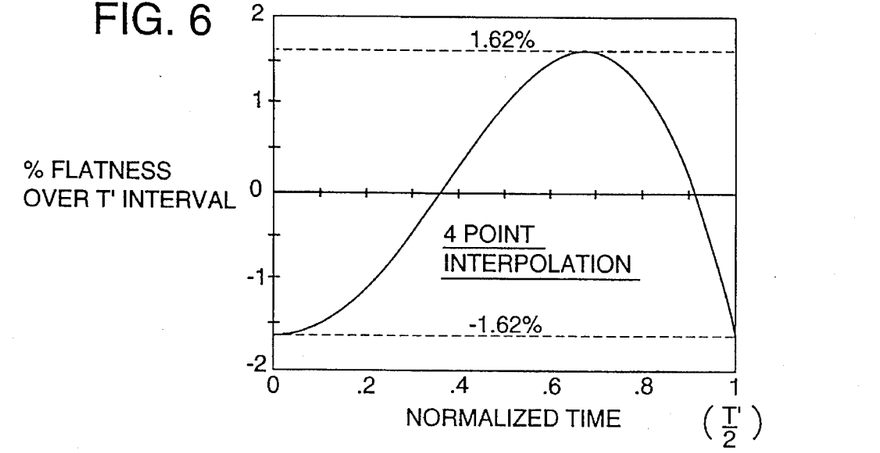
FIG. 6 shows that the deviation from perfect flatness of the compromise window of FIG. 5 over the interval T'/2 is ±1.62%.

FIG. 6 shows the deviation from unity of the "flat" portion of the FIG. 5 window between 0 and T'/2. In this example, there is a maximum ripple error of ±1.62% over the T' interval.

Figure 7:
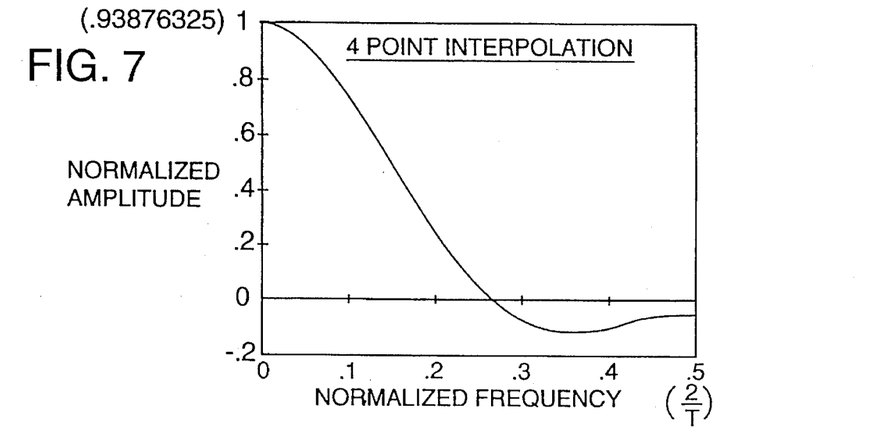
FIG. 7 shows half of the frequency domain convolution kernel corresponding to the compromise window of FIG. 5.

FIG. 7 shows half of the frequency domain convolution kernel corresponding to the compromise time domain interpolation window of FIG. 5. The kernel has a half-width of 2/T, or a full width of 4/T. This identifies the total width as being 4 times the original frequency sample spacing of 1/T, and hence this is a 4 point interpolation kernel. The kernel of FIG. 7 can be represented mathematically by the expression:

$$L_4(f) = a_0 + 2 \sum_{j=1}^{2} a_j \cos \frac{j\pi fT}{2} , |f| \leq \frac{2}{T} \quad (2)$$

where $a_0 = a_1 = 0.24595075$, and $a_2 = 0.1004555$.

The ±1.62% error of the 4 point window of FIGS. 5–7 may not be satisfactory for all occasions. An example of a window that gives better performance is a 10 point interpolation window designed to have an image attenuation factor of more than 100 dB and a flatness error of less than 0.1%, again using a 2:1 oversampling factor. Such a kernel is represented mathematically by the expression:

$$L_{10}(f) = b_0 + 2 \sum_{j=1}^{7} b_j \cos \frac{j\pi fT}{5} , |f| \leq \frac{5}{T} \quad (3)$$

for a suitable set of b coefficients.

Of course, this 10 point shape is wider than the earlier 4 point example. Still further accuracy improvements can be achieved with higher order windows.

The Appendix at the end of this Detailed Description describes the procedure used by applicant for designing interpolation windows.

The quality of the selected convolution kernel can be checked by resampling the interpolated frequency domain spectrum at the original frequency spacing (1/T). The difference between the result of this process, and the original frequency data, is a measure of the accuracy of the interpolation procedure.

An advantage of this frequency domain interpolation procedure is that the time interval of interest (and the resulting frequency domain resolution) is decoupled from the actual width of the time record used in the FFT (provided enough oversampling is used to accommodate the interpolation window design that is used). There are several practical applications of this result.

First, suppose that values for the frequency spectrum are desired at a set of preselected frequencies (not necessarily uniformly spaced). The preferred procedure is to collect a set of time data T'. This data is then windowed, typically in the time domain. (This windowing operation is different than the interpolation window discussed earlier, and serves to alleviate leakage problems in the spectrum associated with the abrupt truncation of the time waveform at the ends of the T' region. A Hanning window is an example of a window suitable for this purpose. To avoid confusion with the interpolation window, such windows are hereinafter referred to as shaping windows.) The windowed data is next padded with enough zeros (out to T) to equal or exceed the oversampling factor for the interpolation window design that is used. (That is, T is made long enough that the skirts of the interpolation window decay far enough down to provide image attenuation of the desired level outside the interval T.) An FFT or discrete Fourier transform is then performed using the zero-padded time record T, giving a discrete frequency spectrum at 1/T intervals. This sampled spectrum is then convolved with the interpolation kernel and evaluated at each of the preselected frequencies of interest. This constitutes the resampling operation. Any discrete tones in the original time record corresponding to any of the preselected frequency values will then appear as single lines in the frequency spectrum. The only errors will be those caused by any residual leakage resulting from the shaping window that was used over the T' interval.

Figure 8:
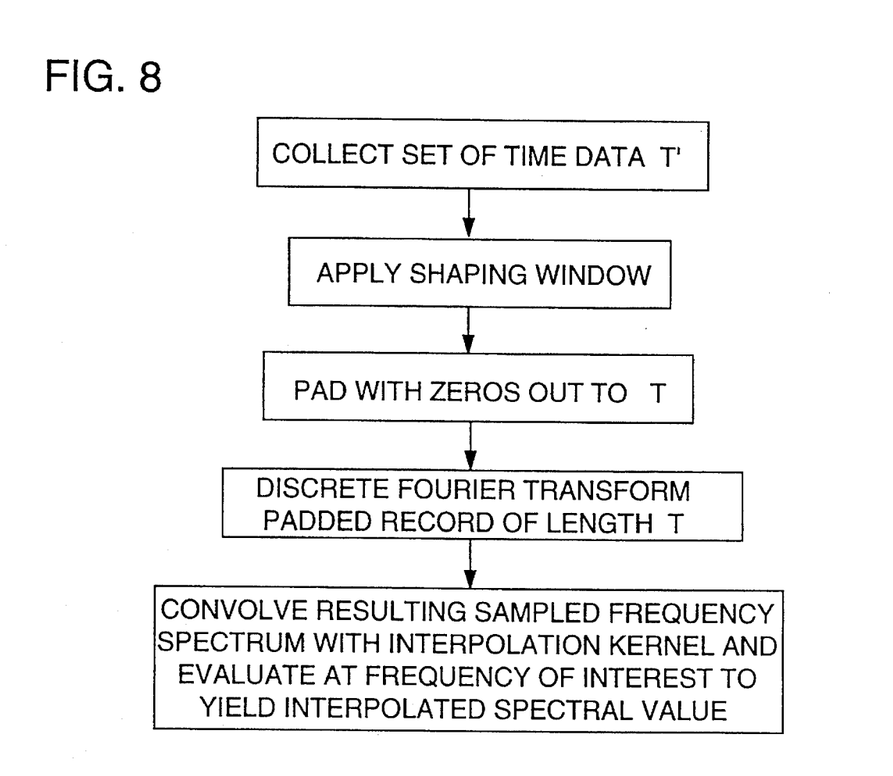
FIG. 8 is a flow chart illustrating a method of spectral analysis according to the present invention.
Figure 9:
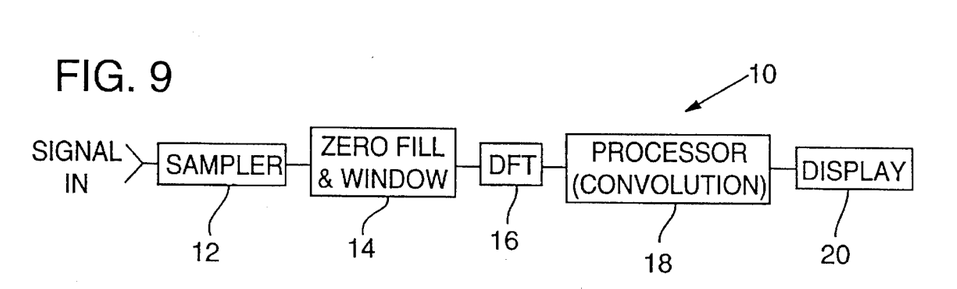
FIG. 9 is a block diagram of a spectral analysis instrument according to the present invention.

The foregoing process is summarized in the flow chart of FIG. 8. A signal analysis instrument 10 capable of performing the illustrated process is shown in FIG. 9. Instrument 10 includes a sampler 12, a zero-filling and windowing block 14, a DFT processor 16, an interpolation processor 18, and a display 20. (Typically, the functions of blocks 14–18 would be implemented by a microprocessor, such as the Motorola MC68030.) Prior art spectrum analyzers may be adapted to serve as instrument 10 by suitable programming of the instrument microprocessor to effect the zero-filling and convolution operations.

If all frequencies in the preselected set are harmonics of a fundamental component having a period T', then a rectangular shaping window, having a width equal to this period, can be used without causing any leakage errors in the frequency spectrum. As before, the total time record will be of length T, where T is long enough to satisfy the required oversampling factor of the interpolation window being used. The interval between T' and T is padded with zeros. An FFT is then performed to obtain the spectrum sampled at 1/T intervals. The convolution kernel is next applied, and the values of the resulting curve are determined at 1T' intervals to effect resampling. The result is a set of discrete lines at the fundamental frequency and at each harmonic frequency without any leakage due to the rectangular time window.

A second application of this procedure is in the display of a frequency spectrum, where the display resolution can be decoupled from the actual frequency resolution of the measured spectrum. As long as the sample spacing in the displayed spectrum is no greater than 1/T', there is no loss of information. Thus, the display can be expanded by an arbitrary amount by simply interpolating and resampling at smaller frequency intervals. The line shape introduced around each frequency component by the shaping window will become visible in greater detail as the spectral display is expanded by increasing factors.

It will be recognized that this second application permits an FFT-based spectrum analysis instrument to produce a continuous curve representing a signal's spectral composition, rather than a series of discrete lines—one corresponding to each DFT "bin." Unlike prior art interpolation techniques, this continuous curve accurately preserves the corresponding time data in the T' interval.

A third application arises in determining the amplitude and/or phase of a sine wave component that falls between the 1/T spacings of a sampled spectrum. In the prior art, the amplitude of such a signal is determined by resort to a flat-top window. Such a window has a complex shape in the time domain, but derives its name from its flat-top shape in the frequency domain. A signal that has been windowed in this fashion and transformed to the frequency domain is smeared across a range of frequencies, but its amplitude can be determined, to within a fraction of a percent, from the maxima of the smeared shape. The tradeoff is that frequency resolution is lost by this smearing effect.

The present invention permits such sine wave components to be accurately analyzed, both in frequency as well as amplitude and phase. The shaping window can be selected to reduce leakage without requiring a flat top. Then the peak of the line shape can be displayed by means of interpolation and resampling with arbitrarily small frequency spacings. Typically, the equivalent noise bandwidth (frequency resolution) of a flat-top window is about twice that otherwise needed for the same leakage reduction capabilities, so the effective frequency resolution can be halved by eliminating the flat-top window and using frequency domain interpolation and resampling.

In all of the foregoing applications, the length of the desired time record T' can be selected with arbitrary precision, and is not dictated by the sampling rate used to collect the time record. In other words, the interpolation window can have a width that spans a non-integer number of time samples, if desired.

From the foregoing disclosure, it will be appreciated that the present invention essentially permits the resolution of frequency domain functions and the length of the corresponding desired time record to be decoupled from the length of the original measured time record. The disclosures of my above-referenced applications teach how the effective resolution of time domain waveforms along with the bandwidth of the corresponding frequency domain spectrum can be decoupled from the original time sampling interval. Together, these disclosures provide a framework by which traditional constraints in the field of discrete or digital signal analysis can be overcome, resulting in greatly enhanced signal analysis instruments.

Having illustrated and described the principles of my invention with reference to several applications thereof, it should be apparent to those skilled in the art that the invention can be modified in arrangement and detail without departing from such principles. For example, while the invention has been illustrated with reference to applications in which a spectral amplitude and/or phase function is interpolated and resampled, it will be recognized that the same techniques can be applied to other frequency domain functions, including power spectra, transfer functions, coherence functions, etc. (Power spectra require a particularly flat interpolation window due to the quadratic nature of such functions, as contrasted with the linear nature of magnitude/phase functions.) Similarly, while the invention has been illustrated with reference to applications in which a shaping window is applied to data in the time domain, it will be recognized that this operation can likewise be effected by a corresponding convolution in the frequency domain. Still further, while the invention has been illustrated with reference to applications in which a time record is first acquired and is thereafter transformed to the frequency domain, it will be recognized that the principles of the invention are equally applicable to the processing of data that originates in the frequency domain.

In view of the many possible embodiments to which the principles of my invention may be put, it should be recognized that the detailed embodiments are illustrative only and should not be taken as limiting the scope of my invention. Rather, I claim as my invention all such embodiments as may come within the scope and spirit of the following claims and equivalents thereto.

APPENDIX

In order to obtain a frequency domain convolution kernel that is finite in extent, it is sufficient to construct a periodic function in the frequency domain with each period having the desired width and shape, and then multiply this periodic function by a rectangle centered on one cycle of the function and having a width of one period. The corresponding time window will comprise a set of delta or impulse functions spaced apart by the reciprocal of the frequency domain period, convolved with the inverse Fourier transform of the frequency domain rectangle.

It is well known that a Fourier series of sines and cosines can be constructed to produce a periodic function in which each period has an essentially arbitrary shape. In this application, this series of sines and cosines will be in the frequency domain rather than in the time domain. Thus, the expression for the frequency domain convolution kernel can be written as:

$$K(f) = \sqcap(f/F) \left\{ a_0 + 2 \sum_{j=1}^{\infty} [a_j \cos(j2\pi f/F) + b_j \sin(j2\pi f/F)] \right\} \quad (4)$$

where F is the finite width of the kernel and $\sqcap(f/F)$ is a rectangle centered at the frequency origin having unit height and width F. The a and b coefficients must be chosen to give the proper shape for the kernel within each period.

The shape of the corresponding time window can be written as:

$$k(t) = \sum_{j=-\infty}^{\infty} (a_j + ib_j) \frac{\sin \pi F(t - j/F)}{\pi(t - j/F)} \quad (5)$$

$$= \sin \pi F t \sum_{j=-\infty}^{\infty} (a_j + ib_j) \frac{(-1)^j}{\pi(t - j/F)} \quad (6)$$

where $a_{-j} = a_j$, $b_{-j} = -b_j$, and $b_0 = 0$.

In practice, only a finite number of terms in the series can be used, so the summation limits will be finite. Note that the k(t) window has zeros at all integer multiple of 1/F except where poles occur from one of the denominators in the finite series. Also note that the series is in the form of a partial fraction expansion of the quotient of two polynomials in time. If the index range is $-m \leq j \leq m$, then the denominator polynomial will be of order 2m+1 and the numerator polynomial will be of order 2 m. Exactly 2 m+1 of the original zeros in the sin$\pi$Ft function will be removed by this denominator polynomial, and 2 m new zeros will be introduced by the numerator polynomial. The zero removed from the origin will usually be placed at infinity. The locations of the remaining new zeros will be determined by the a and b coefficients in the series.

In the general case, any of the a or b coefficients can be complex quantities, and both the frequency domain kernel K(f) and the corresponding time window k(t) can be complex shapes. However, in most cases of practical interest the desired time window will be both even and real, implying that the frequency domain kernel will also be both even and real, which further implies that the a coefficients be reals and that the b coefficients all be zero.

The width F of the convolution kernel will be dictated by the number of numerator zeros that are altered, in conjunction with the oversampling factor T/T'. For example, a 4 point convolution kernel would have a width of 4/T, and for a 2:1 oversampling factor involves the alteration of two pairs of the numerator zeros (plus the one at the origin). For the same 2:1 oversampling factor, a 10 point kernel would have a width of 10/T and would involve the alteration of seven pairs of numerator zeros. It is a coincidence that the 4 point kernel involves the alteration of 4 zeros. There is no relation between the kernel width and the number of new zeros.

Thus, the procedure for designing a frequency domain interpolation kernel K(f) is to adjust the values of the coefficients along with the number of series terms to give a time window that has a sufficiently flat shape over the desired time interval T' along with sufficient attenuation of the images of this time interval along the time axis. The oversampling factor T/T' determines the time interval allowed for the transition between the flat region and the attenuating region. The easiest way to adjust these coefficients is to adjust the locations of the new zeros until the proper shape is obtained, and then to form the resulting numerator polynomial to obtain the final series coefficient values. In general, the numerator zeros used to attenuate the time domain images will be located exactly on the real time axis outside of the desired T' interval, while those used to flatten the T' interval will be placed in the complex time plane offset symmetrically about the real time axis but essentially within the T' interval.

Note that even if the interpolation time window is an even real function, the zeros of the numerator polynomial will sometimes be complex quantities, with complex roots appearing in conjugate pairs. In the general case, the time window need be neither even nor real, so the numerator roots can be anywhere in the complex time plane. The concept of a complex frequency plane is very common, but the complex time plane concept is encountered less often.

There may be times when a non-even interpolation time window is desired, and there may be times when a complex time window is needed. Both of these cases are included in the above theory.

I claim:

1. An instrument for determining the spectral composition of a signal, the instrument comprising:

a sampler for sampling the signal in the time domain over a record length T to produce sampled time domain data;

DFT means for producing sampled frequency domain data corresponding to the sampled time domain data, the frequency domain data being sampled at frequency intervals of 2/T; and processing means for processing the sampled frequency domain data to produce interpolated frequency domain data representing a spectral component of the signal at a frequency other than a multiple of 1/T, the interpolated frequency domain data corresponding to the sampled time domain data to within a specified degree of accuracy.

2. The instrument of claim 1 in which the processing means includes means for preserving a protected interval T' of the sampled time domain data corresponding to the interpolated frequency domain data to within the specified degree of accuracy.

3. The instrument of claim 2 in which the processing means includes means for generating a continuous spectral curve representing the spectral composition of the signal over a continuous range of frequencies, and in which the instrument further includes display means for presenting the continuous spectral curve, rather than a line spectrum representing the spectral composition of the signal at discrete frequencies.

4. A signal processing method comprising the steps:

obtaining a plurality of time sampled data points over a record length T';

producing a sampled frequency spectrum by applying a transform to a set of time domain data that includes the plurality of time sampled data points; and convolving the sampled frequency spectrum with an interpolation kernel centered about a new frequency to interpolate and resample at said new frequency.

5. The method of claim 4 in which the control step includes processing to effect shaping of the time sampled data points with a non-rectangular window.

6. The method of claim 5 in which said processing comprises convolving the sampled frequency spectrum with the Fourier transform of the non-rectangular window.

7. The method of claim 4 in which the interpolation kernel corresponds to a non-rectangular time domain window.

8. The method of claim 4 in which the convolving step includes preserving the time domain counterpart of the interpolated spectrum within the time period T' to within a specified degree of accuracy.

9. The method of claim 4 in which the convolving step includes convolving the sampled frequency spectrum with a continuous interpolation kernel to obtain interpolated frequency samples spaced at intervals of 1/T'.

10. The method of claim 4 in which the producing step includes:

padding said plurality of time sampled data points with zeros out to a time period T, where T>T', to obtain a padded time record of length T; and producing a sampled frequency spectrum by applying a Fourier transform to the padded time record.

11. The method of claim 10 in which convolving step includes convolving the sampled frequency spectrum with a continuous interpolation kernel to obtain interpolated frequency samples spaced at intervals of 1/T'.

12. The method of claim 10 in which the interpolation kernel corresponds to a time domain window having a flat portion over the interval T', and having an image attenuation factor of at least 42 dB.

13. The method of claim 4 in which the convolving step includes convolving the sampled frequency spectrum with a plurality of convolution kernels, said plurality of convolution kernels being chosen from a group comprising discrete convolution kernels and continuous convolution kernels.

14. The method of claim 4 in which the convolving step includes convolving the sampled frequency spectrum with interpolation kernels and evaluating at a plurality of new frequencies.

15. A signal processing method comprising the steps:

providing a sampled frequency spectrum, the samples being spaced at frequency intervals of 1/T;

evaluating the convolution of the sampled frequency spectrum with an interpolation kernel at new frequencies spaced less than or equal to 1/T' to interpolate and resample at said new frequencies, said interpolation preserving a protected portion T' of a time domain sequence T corresponding to the sampled frequency spectrum.

16. The method of claim 15 in which the protected portion T' of the time domain sequence T corresponding to the sampled frequency spectrum is preserved to within a specified degree of accuracy.

17. The method of claim 15 in which the convolving step includes convolving the sampled frequency spectrum with a plurality of convolution kernels, said plurality of convolution kernels being chosen from a group comprising discrete convolution kernels and continuous convolution kernels.

18. The method of claim 15 in which the convolving step includes convolving the sampled frequency spectrum with interpolation kernels and evaluating at a plurality of new frequencies.

19. A method of producing interpolated values that contain accurate information about the time domain of an analog signal, the method comprising:

providing a sampled frequency spectrum corresponding to the spectral content of the analog signal at a plurality of discrete frequencies; and interpolating between said discrete frequencies to obtain frequency domain data at a new frequency, the interpolating comprising the substep of convolving the sampled frequency spectrum with an interpolation kernel centered about the new frequency.

20. A method of frequency domain analysis comprising:

sampling an input signal to obtain time domain data;

processing a record of length T of said time domain data to yield a set of corresponding frequency domain data, said frequency domain data representing spectral components of the input signal at a plurality of spaced frequency points, the spacing of said frequency points depending on the record length T; and interpolating to obtain frequency domain data for at least one point in between said spaced frequency points, said interpolation preserving the accuracy of a protected interval T' of the time domain record to within a specified accuracy.

21. The method of claim 20 which includes interpolating the frequency domain data to obtain a continuous spectrum of frequency domain data in between said spaced frequency points.

22. A method of frequency domain analysis comprising:

sampling an input signal to obtain original time domain data;

processing a record of length T of aid original time domain data to yield a set of corresponding frequency domain data, said frequency domain data representing spectral components of the input signal at a plurality of spaced frequency points; and interpolating to obtain frequency domain data or at least one point in between said spaced frequency points, the frequency domain data including said interpolated point comprising an enhanced set of frequency domain data, wherein time domain data corresponding to said enhanced set of frequency domain data matches the original time domain data without corruption.

23. A method of frequency domain analysis comprising:

sampling an input signal to obtain time domain data;

processing a record of length T of said time domain data to yield a set of corresponding frequency domain data, said frequency domain data representing spectral components of the input signal at a plurality of spaced frequency points; and interpolating to obtain frequency domain data for at least one point in between said spaced frequency points, said interpolation including convolving data from said set of corresponding frequency domain data with an interpolation kernel.

24. The method of claim 23 which includes interpolating the frequency domain data to obtain a continuous spectrum of frequency domain data in between said spaced frequency points.

25. In a method of frequency domain analysis of a signal that includes processing a time domain record of length T to obtain a set of frequency domain data corresponding thereto, an improvement comprising processing the frequency domain data to resolve additional frequency domain components of the signal with a resolution not limited by the length T of the time domain record.

26. The method of claim 25 in which said processing preserves the accuracy of a protected interval T' of the time domain record to within a specified accuracy.

27. The method of claim 25 in which said processing does not corrupt the time domain record.

28. The method of claim 28 in which said processing includes interpolating to obtain a continuous spectrum of frequency domain data.

29. The method of claim 25 in which said processing step includes processing data from the set of frequency domain data.

30. The method of claim 29 in which the processing includes convolving data from said set of frequency domain data with an interpolation kernel.

31. In a method of processing of a time record of length T to obtain a corresponding set of frequency domain data, an improvement comprising interpolating the frequency domain data to yield, additional frequency domain data, said interpolating decoupling resolution of the additional frequency domain data from the length T of the time record.

32. A method of processing a signal so as to preserve attributes in a complementary Fourier domain comprising:

obtaining an initial set of sampled data, said set including samples representing a signal's attributes at a plurality of spaced apart points in a first Fourier domain;

producing an enhanced set of data by convolving said initial set of sampled data with an interpolation kernel so as to yield data at one or more points in addition to said plurality of spaced apart points;

said interpolation kernel being of such a type that a transformation of the enhanced set of data into a second, complementary Fourier domain substantially matches a transformation of the initial set of data into said second domain.

33. A spectrum analysis instrument comprising:

an input port for receiving an input signal;

a sample coupled to the input port for producing an initial set of sampled data, said initial set of sampled data comprising samples representing attributes of the input signal at a plurality of spaced apart points in a first Fourier domain;

a display; and a microprocessor interposed between the sampler and the display, the microprocessor including means for producing an enhanced set of data by convolving said initial set of sampled data with an interpolation kernel so as to yield data at one or more points in addition to said plurality of spaced apart points, said interpolation kernel being of such a type that a transformation of the enhanced set of data into a second, complementary Fourier domain substantially matches a transformation of the initial set o data into said second domain.

34. A spectrum analysis instrument comprising:

an input port for for receiving an input signal;

a sampler coupled to the input port for producing a time domain record of length T corresponding to said input signal;

a display; and a microprocessor interposed between the sampler and the display, the microprocessor including means for processing the time domain record to obtain a set of frequency domain data corresponding thereto, the microprocessor further including means for processing the frequency domain data to resolve additional frequency domain components of the signal with a resolution not limited by the length T of the time domain record.

35. A spectrum analysis instrument comprising:

an input port for receiving an input signal;

a sampler coupled to the input port for producing a time record of length T corresponding to said input signal;

a display; and a microprocessor interposed between the sampler and the display, the microprocessor including means for processing the time record of length T to obtain a corresponding set of frequency domain data, the microprocessor further including means for interpolating the frequency domain data to yield additional frequency domain data, said interpolating decoupling resolution of the additional frequency domain data from the length T of the time record.

\* \* \* \* \*